(12) United States Patent
Tsai et al.

(10) Patent No.: US 11,532,480 B2
(45) Date of Patent: Dec. 20, 2022

(54) METHODS OF FORMING CONTACT FEATURES IN SEMICONDUCTOR DEVICES

(71) Applicant: Taiwan Semiconductor Manufacturing Co., Ltd., Hsinchu (TW)

(72) Inventors: Chen-Hung Tsai, Hsinchu (TW); Chen-Ming Lee, Taoyuan County (TW); Fu-Kai Yang, Hsinchu (TW); Mei-Yun Wang, Hsin-Chu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 50 days.

(21) Appl. No.: 17/328,655

(22) Filed: May 24, 2021

(65) Prior Publication Data

US 2021/0280426 A1   Sep. 9, 2021

Related U.S. Application Data

(63) Continuation of application No. 16/366,905, filed on Mar. 27, 2019, now Pat. No. 11,018,011.

(60) Provisional application No. 62/724,285, filed on Aug. 29, 2018.

(51) Int. Cl.
| | |
|---|---|
| *H01L 21/285* | (2006.01) |
| *H01L 29/45* | (2006.01) |
| *H01L 29/06* | (2006.01) |
| *H01L 29/66* | (2006.01) |
| *H01L 21/02* | (2006.01) |
| *H01L 21/311* | (2006.01) |
| *H01L 29/78* | (2006.01) |

(52) U.S. Cl.
CPC .. *H01L 21/28518* (2013.01); *H01L 21/02063* (2013.01); *H01L 21/31116* (2013.01); *H01L 29/0649* (2013.01); *H01L 29/45* (2013.01); *H01L 29/665* (2013.01); *H01L 29/66795* (2013.01); *H01L 29/7851* (2013.01)

(58) Field of Classification Search
CPC ......... H01L 21/28518; H01L 21/02063; H01L 21/31116; H01L 29/0649; H01L 29/45; H01L 29/665; H01L 29/66795; H01L 29/7851
USPC ........................................................ 257/384
See application file for complete search history.

(56) References Cited

U.S. PATENT DOCUMENTS

| | | | |
|---|---|---|---|
| 8,772,109 B2 | 7/2014 | Colinge | |
| 8,785,285 B2 | 7/2014 | Tsai et al. | |
| 8,816,444 B2 | 8/2014 | Wann et al. | |

(Continued)

*Primary Examiner* — Igwe U Anya
(74) *Attorney, Agent, or Firm* — Haynes and Boone, LLP (57) ABSTRACT

A semiconductor structure includes an isolation feature disposed over a semiconductor substrate, a semiconductor fin disposed over the semiconductor substrate and adjacent to the isolation feature, a source/drain (S/D) feature disposed over the semiconductor substrate and apart from the isolation feature, an interlayer dielectric (ILD) layer disposed over the isolation feature and the S/D feature, a first contact plug disposed in the ILD layer and over the isolation feature, a second contact plug disposed in the ILD layer and over the S/D feature, and a dielectric layer between surfaces of the first contact plug and the ILD layer and between a sidewall of the second contact plug and the ILD layer, where a bottom surface of the second contact plug is free of the dielectric layer.

20 Claims, 8 Drawing Sheets

(56) References Cited

U.S. PATENT DOCUMENTS

| | | |
|---|---|---|
| 8,823,065 B2 | 9/2014 | Wang et al. |
| 8,860,148 B2 | 10/2014 | Hu et al. |
| 9,105,490 B2 | 8/2015 | Wang et al. |
| 9,236,267 B2 | 1/2016 | De et al. |
| 9,236,300 B2 | 1/2016 | Liaw |
| 9,520,482 B1 | 12/2016 | Chang et al. |
| 9,576,814 B2 | 2/2017 | Wu et al. |
| 9,589,847 B1 | 3/2017 | Chi et al. |
| 9,673,100 B2 | 6/2017 | Hung et al. |
| 10,074,558 B1 | 9/2018 | Tsai et al. |
| 10,211,092 B1 | 2/2019 | Cheng et al. |
| 10,374,040 B1 | 8/2019 | Chanemougame et al. |
| 2014/0327080 A1 | 11/2014 | Hung et al. |
| 2017/0358607 A1 | 12/2017 | Balakrishnan et al. |
| 2019/0067276 A1 | 2/2019 | Tsai et al. |
| 2019/0096740 A1* | 3/2019 | Tsai .................. H01L 21/76897 |
| 2019/0312028 A1 | 10/2019 | Park et al. |

* cited by examiner

METHODS OF FORMING CONTACT FEATURES IN SEMICONDUCTOR DEVICES

CROSS-REFERENCE TO RELATED APPLICATIONS

This is a continuation application of U.S. patent application Ser. No. 16/366,905, filed on Mar. 27, 2019, which further claims priority to U.S. Provisional Patent Application Ser. No. 62/724,285 filed on Aug. 29, 2018, the entire disclosure of which is incorporated herein by reference.

BACKGROUND

The semiconductor industry has experienced rapid growth. Technological advances in semiconductor materials and design have produced generations of semiconductor devices where each generation has smaller and more complex circuits than the previous generation. In the course of integrated circuit (IC) evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. But these advances have also increased the complexity of processing and manufacturing semiconductor devices.

For example, many methods have been developed to advance fabrication techniques of fin-like FETs (FinFETs) for improved device performance. In particular, much effort has been focused on methods of improving fabrication of contact features (e.g., source/drain contacts) in FinFETs. While these methods have generally been adequate, they have not been satisfactory in all aspects.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

The following disclosure provides many different embodiments, or examples, for implementing different features of the disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

In addition, the present disclosure may repeat reference numerals and/or letters in the various examples. This repetition is for the purpose of simplicity and clarity and does not in itself dictate a relationship between the various embodiments and/or configurations discussed. Moreover, the formation of a feature on, connected to, and/or coupled to another feature in the present disclosure that follows may include embodiments in which the features are formed in direct contact, and may also include embodiments in which additional features may be formed interposing the features, such that the features may not be in direct contact. In addition, spatially relative terms, for example, "lower," "upper," "horizontal," "vertical," "above," "over," "below," "beneath," "up," "down," "top," "bottom," etc. as well as derivatives thereof (e.g., "horizontally," "downwardly," "upwardly," etc.) are used for ease of the present disclosure of one features relationship to another feature. The spatially relative terms are intended to cover different orientations of the device including the features. Still further, when a number or a range of numbers is described with "about," "approximate," and the like, the term is intended to encompass numbers that are within a reasonable range including the number described, such as within +/−10% of the number described or other values as understood by person skilled in the art. For example, the term "about 5 nm" encompasses the dimension range from 4.5 nm to 5.5 nm.

The present disclosure is generally related to semiconductor devices, and more particularly to field-effect transistors (FETs), such as three-dimensional fin-line FETs (FinFETs). It is an objective of the present disclosure to provide contact features (e.g., source/drain contacts) and methods of making the same during FinFET fabrication processes.

During fabrication of a FinFET structure, source/drain (S/D) contacts are generally formed over both an active region (e.g., an S/D feature) as well as an isolation region (e.g., a shallow-trench isolation, or STI, structure) disposed adjacent to the active region. In many instances, S/D contacts are formed by performing a series of patterning, etching, and deposition processes. While methods of forming S/D contacts are generally adequate, they have not been entirely satisfactory in all aspects. For example, when forming a contact trench (or a contact hole) over the isolation region, a rounded or bowed profile may be developed at the bottom of the trench due to inadvertent loss of a dielectric spacer present in the contact trench and configured for insulation purposes. Such rounded profile may prevent complete formation of the S/D contact and/or may damage any dielectric layer (e.g., an interlayer dielectric layer) disposed between the S/D contact and a neighboring metal gate stack (e.g., high-k metal gate structure). Therefore, for this and other reasons, improvements in methods of forming S/D contacts over an isolation region are desired.

Figure 1:
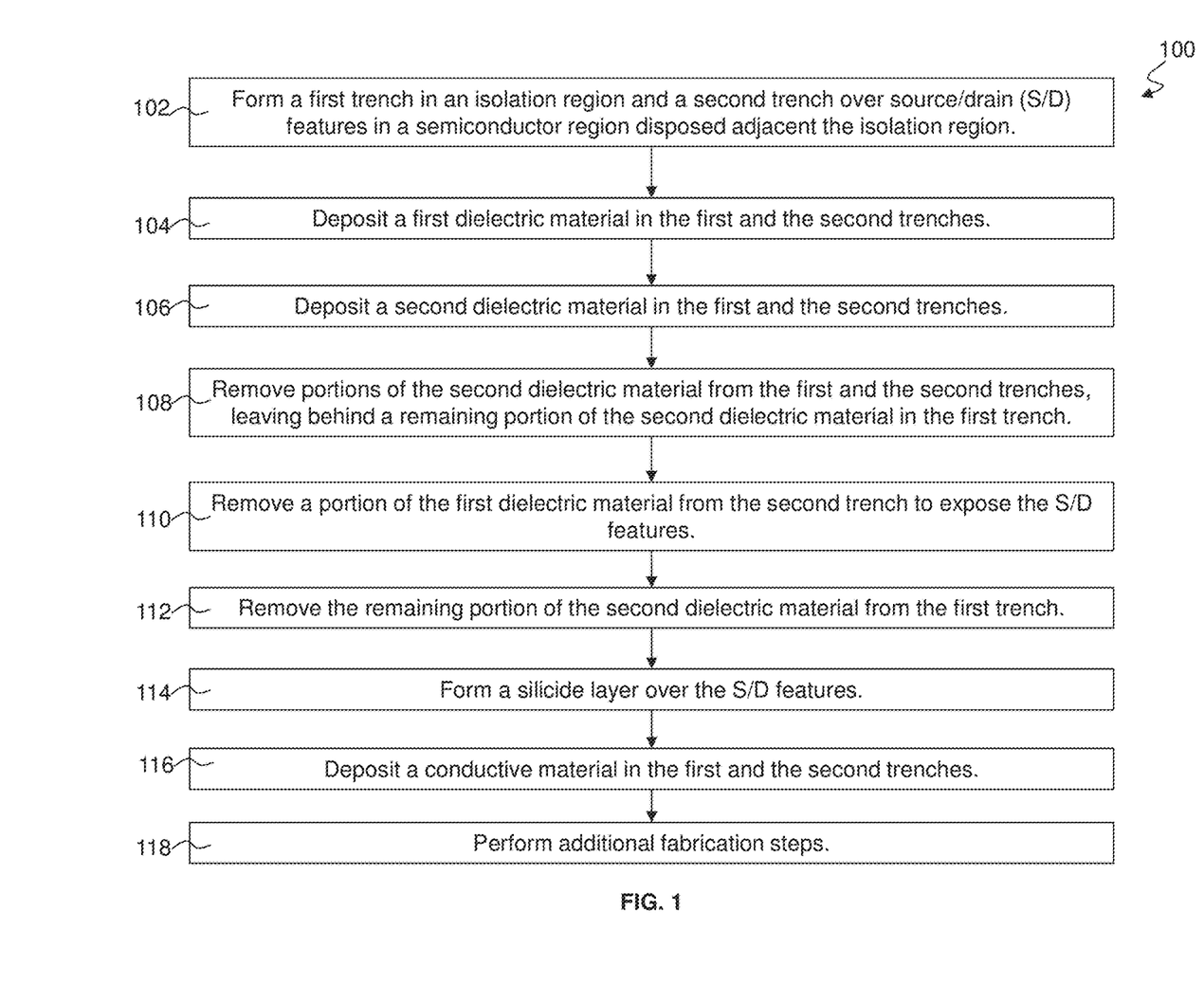
FIG. 1 is a flow chart showing an example method for fabricating a semiconductor device according to various embodiments of the present disclosure.

Referring now to FIG. 1, a flowchart of a method 100 of forming a semiconductor device 200 (hereafter simply referred to as the device 200) is illustrated according to various aspects of the present disclosure. The method 100 is merely an example and is not intended to limit the present disclosure beyond what is explicitly recited in the claims. Additional operations can be provided before, during, and after the method 100, and some operations described can be replaced, eliminated, or moved around for additional embodiments of the method. The method 100 is described below in conjunction with FIGS. 2A-12, which illustrate a portion of the device 200 during the method 100. FIGS. 3-12 are cross-sectional views of the device 200 taken along the dashed line AA' shown in FIGS. 2A and 2B at intermediate steps of the method 100. The device 200 may be an intermediate device fabricated during processing of an IC, or a portion thereof, that may comprise static random-access memory (SRAM) and/or other logic circuits, passive components such as resistors, capacitors, and inductors, and active components such as p-type FETs (PFETs), n-type FETs (NFETs), FinFETs, metal-oxide semiconductor field effect transistors (MOSFET), complementary metal-oxide semiconductor (CMOS) transistors, bipolar transistors, high voltage transistors, high frequency transistors, and/or other memory cells The present disclosure is not limited to any particular number of devices or device regions, or to any particular device configurations. For example, though the device 200 as illustrated is a three-dimensional FinFET device, the present disclosure may also provide embodiments for fabricating planar FET devices. Additional features can be added in semiconductor device 200, and some of the features described below can be replaced, modified, or eliminated in other embodiments of semiconductor device 200.

Figure 2A:
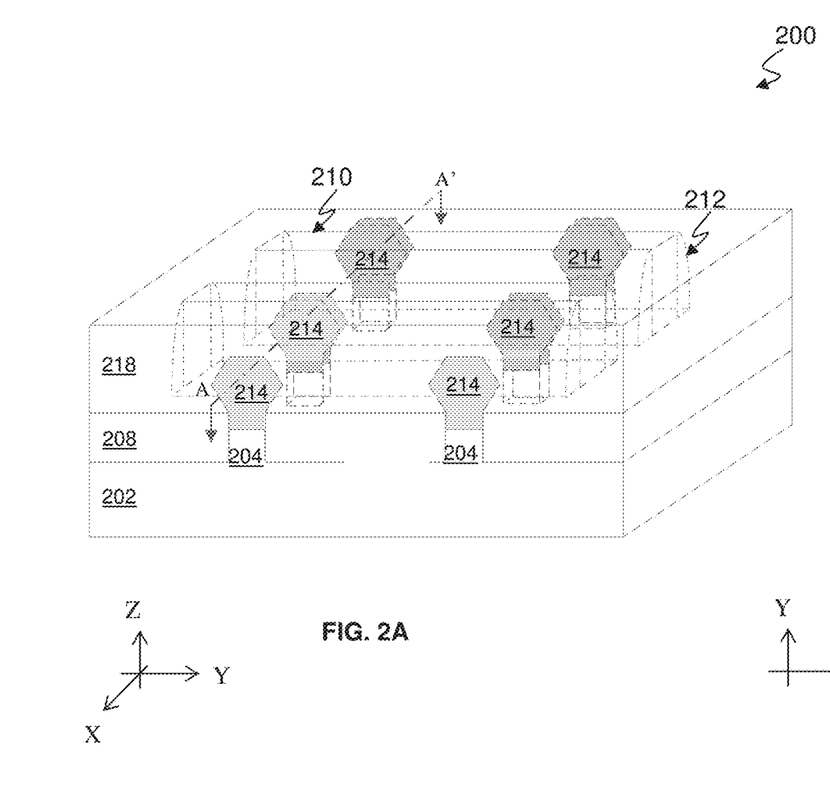
FIG. 2A is a three-dimensional perspective view of a semiconductor device according to various embodiments of the present disclosure.
Figure 2B:
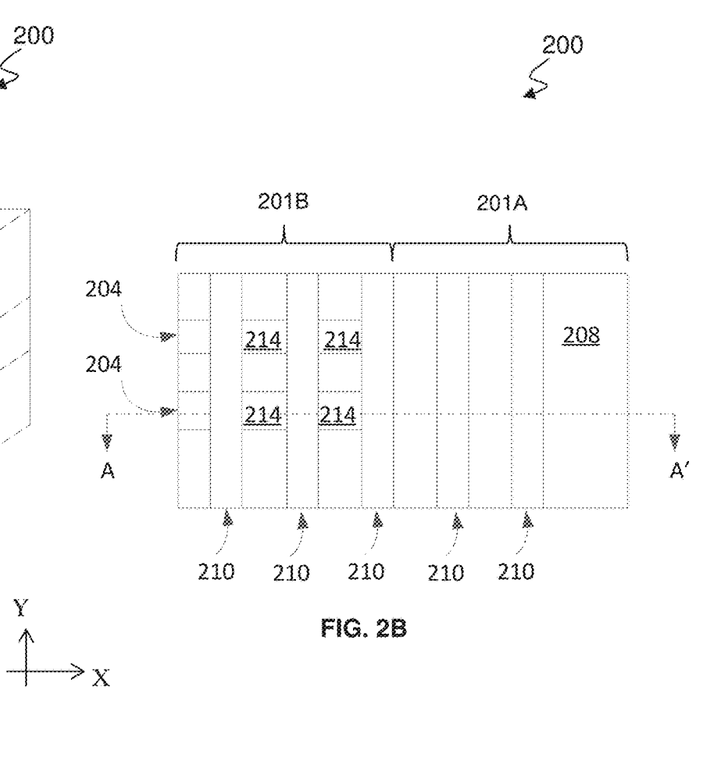
FIG. 2B is a planar top view of the semiconductor device of FIG. 2A according to various embodiments of the present disclosure.

At operation 102, referring to FIGS. 1, 2A, and 2B, the method 100 provides, or is provided with, the device 200 including a substrate 202 having at least one semiconductor layer 204 (e.g., an active region such as a three-dimensional fin; hereafter referred to as the fin 204) disposed thereon, isolation structures 208 disposed over the substrate 202 separating various components of the device 200, high-k metal gate (HKMG) structures 210 disposed in interlayer dielectric (ILD) layer 218 and over the fins 204, source/drain (S/D) features 214 disposed over the fin 204 and interposing adjacent HKMG 210 as depicted in a top view in FIG. 2B. As depicted herein, the fins 204 are oriented lengthwise along the X direction, while the HKMG structures 210 are oriented lengthwise along the Y direction, i.e., generally perpendicular to the fins 204. In many embodiments, as will be discussed in detail below, the device 200 includes additional features such as gate spacers 212 disposed along sidewalls of the HKMG structures 210, hard mask layer(s) (not depicted) disposed over the HKMG structures 210, a dielectric layer (e.g., an ILD layer 220) disposed over the HKMG structures 210, and numerous other features. The device 200 includes a region 201A and a region 201B disposed adjacent the region 201A. Due to the presence of the fins 204, the region 201B may be referred to as a device region or active region, and the region 201A, which includes the isolation structures 208, may be referred to as an isolation region or inactive region. For purpose of simplicity, intermediate steps of the method 100 are hereafter described with reference to cross-sectional views (FIGS. 3-12) of the device 200 taken along a length of the fin 204 (i.e., the dashed line AA' in the X direction).

The substrate 202 may comprise an elementary (single element) semiconductor, such as silicon, germanium, and/or other suitable materials; a compound semiconductor, such as silicon carbide, gallium arsenic, gallium phosphide, indium phosphide, indium arsenide, indium antimonide, and/or other suitable materials; an alloy semiconductor, such as SiGe, GaAsP, AlInAs, AlGaAs, GaInAs, GaInP, GaInAsP, and/or other suitable materials. The substrate 202 may be a single-layer material having a uniform composition. Alternatively, the substrate 202 may include multiple material layers having similar or different compositions suitable for IC device manufacturing. In one example, the substrate 202 may be a silicon-on-insulator (SOI) substrate having a silicon layer formed on a silicon oxide layer. In another example, the substrate 202 may include a conductive layer, a semiconductor layer, a dielectric layer, other layers, or combinations thereof.

In some embodiments where the substrate 202 includes FETs, various doped regions, such as source/drain regions, are disposed in or on the substrate 202. The doped regions may be doped with p-type dopants, such as phosphorus or arsenic, and/or n-type dopants, such as boron or $BF_2$, depending on design requirements. The doped regions may be formed directly on the substrate 202, in a p-well structure, in an n-well structure, in a dual-well structure, or using a raised structure. Doped regions may be formed by implantation of dopant atoms, in-situ doped epitaxial growth, and/or other suitable techniques.

The fins 204 may be fabricated using suitable processes including photolithography and etch processes. The photolithography process may include forming a photoresist layer (resist) overlying the substrate 202, exposing the resist to a pattern, performing post-exposure bake processes, and developing the resist to form a masking element (not shown) including the resist. The masking element is then used for etching recesses into the substrate 202, leaving the fins 204 on the substrate 202. The etching process may include dry etching, wet etching, reactive ion etching (RIE), and/or other suitable processes.

Numerous other embodiments of methods for forming the fins 204 may be suitable. For example, the fins 204 may be patterned using double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers, or mandrels, may then be used to pattern the fins.

The isolation structures 208 may include silicon oxide, silicon nitride, silicon oxynitride, fluoride-doped silicate glass (FSG), a low-k dielectric material, and/or other suitable materials. The isolation structures 208 may include shallow trench isolation (STI) features. In one embodiment, the isolation structures 208 are formed by etching trenches in the substrate 202 during the formation of the fins 204. The trenches may then be filled with an isolating material described above by a deposition process, followed by a chemical mechanical planarization (CMP) process. Other isolation structure such as field oxide, local oxidation of silicon (LOCOS), and/or other suitable structures may also be implemented as the isolation structures 208. Alternatively, the isolation structures 208 may include a multi-layer structure, for example, having one or more thermal oxide liner layers. The isolation structures 208 may be deposited by any suitable method, such as chemical vapor deposition (CVD), flowable CVD (FCVD), spin-on-glass (SOG), other suitable methods, or combinations thereof.

Still referring to FIGS. 2A and 2B, the device 200 includes S/D features 214 disposed over the fins 204 and adjacent to the HKMG structure 210. The S/D features 214 may be formed by any suitable techniques, such as etching processes followed by one or more epitaxy processes. In one example, one or more etching processes are performed to remove portions of the fins 204 to form recesses (not shown) therein, respectively. A cleaning process may be performed to clean the recesses with a hydrofluoric acid (HF) solution or other suitable solution. Subsequently, one or more epitaxial growth processes are performed to grow epitaxial features in the recesses. Each of the S/D features 214 may be suitable for a p-type FinFET device (e.g., a p-type epitaxial material) or alternatively, an n-type FinFET device (e.g., an n-type epitaxial material). The p-type epitaxial material may include one or more epitaxial layers of silicon germanium (epi SiGe), where the silicon germanium is doped with a p-type dopant such as boron, germanium, indium, and/or other p-type dopants. The n-type epitaxial material may include one or more epitaxial layers of silicon (epi Si) or silicon carbon (epi SiC), where the silicon or silicon carbon is doped with an n-type dopant such as arsenic, phosphorus, and/or other n-type dopant.

The device 200 further includes the HKMG structures 210 disposed over a channel region of the fins 204. The HKMG structure 210 includes a high-k (i.e., having a dielectric constant greater than that of silicon oxide, which is about 3.9) dielectric layer (not depicted) disposed over the fins 204 and a metal gate electrode (not depicted) disposed over the high-k dielectric layer. The metal gate electrode may further include at least one work function metal layer and a bulk conductive layer disposed thereover. The work function metal layer may be a p-type or an n-type work function metal layer. Exemplary work function materials include TiN, TaN, Ru, Mo, Al, WN, $ZrSi_2$, $MoSi_2$, $TaSi_2$, $NiSi_2$, Ti, Ag, TaAl, TaAlC, TiAlN, TaC, TaCN, TaSiN, Mn, Zr, other suitable n-type work function materials, or combinations thereof. The bulk conductive layer may include copper (Cu), tungsten (W), aluminum (Al), cobalt (Co), other suitable materials, or combinations thereof. The HKMG structures 210 may further include numerous other layers (not depicted), such as an interfacial layer disposed between the fins 204 and the high-k dielectric layer, capping layers, hard mask layers, barrier layers, other suitable layers, or combinations thereof. Various layers of the HKMG structure 210 may be deposited by any suitable method, such as chemical oxidation, thermal oxidation, atomic layer deposition (ALD), CVD, physical vapor deposition (PVD), plating, other suitable methods, or combinations thereof. A polishing process, such as chemical mechanical polishing (CMP), may be performed to remove excess materials from a top surface of the HKMG structure 210 to planarize a top surface of the device 200.

The device 200 further includes gate spacers 212 disposed on sidewalls of the HKMG structures 210. The gate spacers 212 may include a dielectric material, such as silicon oxide, silicon nitride, silicon carbide, silicon oxynitride, other suitable dielectric materials, or combinations thereof. The gate spacers 212 may be a single layered structure or a multi-layered structure as depicted herein. The gate spacers 212 may be formed by first depositing a blanket of spacer material over the device 200, and then performing an anisotropic etching process to remove portions of the spacer material to form the gate spacers 212 on sidewalls of the HKMG structures 210.

In many embodiments, still referring to FIGS. 2A and 2B, the HKMG structures 210 are formed after other components of the device 200 (e.g., the S/D features 214) are fabricated. Such process is generally referred to as a gate replacement process, which includes forming a dummy gate structure (not depicted) as a placeholder for the HKMG structures 210, forming the S/D features 214, optionally forming a contact etch-stop layer, or CESL (not depicted), over the S/D features 214, forming an interlayer dielectric (ILD) layer 218 over the dummy gate structure and the S/D features 214, planarizing the ILD layer 218 by, for example, CMP, to expose a top surface of the dummy gate structure, removing the dummy gate structure to form a trench in the ILD layer 218 that exposes a channel region of the fins 204, and forming the HKMG structures 210 in the trench to complete the gate replacement process. Thereafter, an additional ILD layer, e.g., the ILD layer 220, may be deposited over the planarized HKMG structures 210 and the ILD layer 218. In some embodiments, the ILD layers 218 and 220 each includes a dielectric material, such as tetraethylorthosilicate (TEOS), un-doped silicate glass, or doped silicon oxide such as borophosphosilicate glass (BPSG), fused silica glass (FSG), phosphosilicate glass (PSG), boron doped silicon glass (BSG), other suitable dielectric materials, or combinations thereof. In the depicted embodiment, the ILD layers 218 and 220 each includes an oxide-containing dielectric material. The ILD layers 218 and 220 may include a multi-layer structure having multiple dielectric materials and may be formed by a deposition process such as, for example, CVD, flowable CVD (FCVD), spin-on-glass (SOG), other suitable methods, or combinations thereof. The CESL may comprise silicon nitride, silicon oxynitride, silicon nitride with oxygen or carbon elements, other suitable materials, or combinations thereof, and may be formed by CVD, PVD, ALD, other suitable methods, or combinations thereof.

Figure 3:
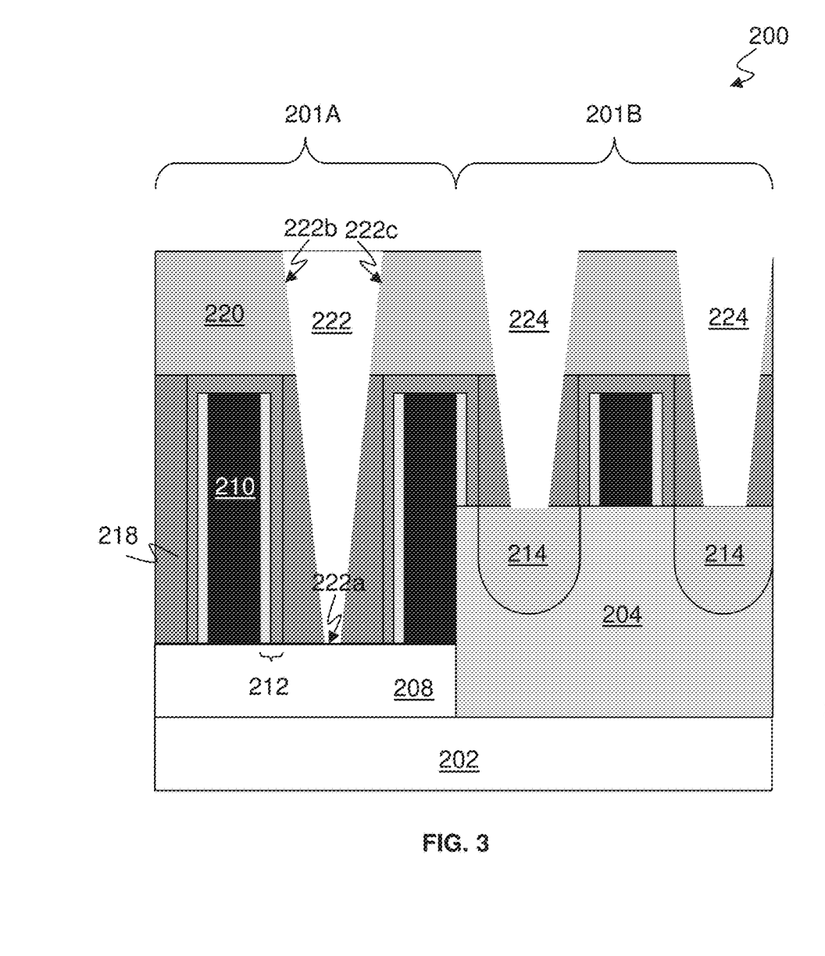
FIGS. 3, 4, 5, 6, 7, 8, 9, 10A, 10B, 11, and 12 are cross-sectional views of the semiconductor device of FIGS. 2A-2B during intermediate steps of the example method of FIG. 1.

Referring to FIGS. 1 and 3, the method 100 at operation 102 forms a trench 222 and a trench 224 in the ILD layers 218 and 220. The trench 222 is formed over the isolation structures 208 in the region 201A and the trench 224 is formed over the S/D features 214 in the region 201B. In other words, the trench 222 exposes portions of the isolation structures 208, while the trench 224 exposes portions of the S/D features 214. The trenches 222 and 224 may be formed by first depositing a masking element (not depicted) over the device 200 that exposes portions of the device 200 where the trenches 222 and 224 are formed. The masking element may include at least a resist layer (e.g., a photoresist layer) that may be patterned by a series of exposure and development processes. Subsequently, the ILD layer 218 and 220 may be etched by one or more etching processes in the regions 201A and 201B using the patterned masking element as an etching mask. The etching process may be a dry etching process, a wet etching process, an RIE, other suitable etching process, or combinations thereof. In the present disclosure, the trenches 222 and 224 are etched by a dry etching process using an etchant that includes a fluorine-containing gas (e.g., $CF_4$, $SF_6$, $CH_2F_2$, $CHF_3$, and/or $C_2F_6$), hydrogen ($H_2$), nitrogen ($N_2$), other suitable gases, or combinations thereof. In an example embodiment, the etchant includes a combination of $CF_4$, $N_2$, and/or $H_2$. In some embodiments, the trenches 222 and 224 are formed together, i.e., by the same patterning and etching processes. Alternatively, the trenches 222 and 224 may be formed in separate patterning and etching processes.

Figure 4:
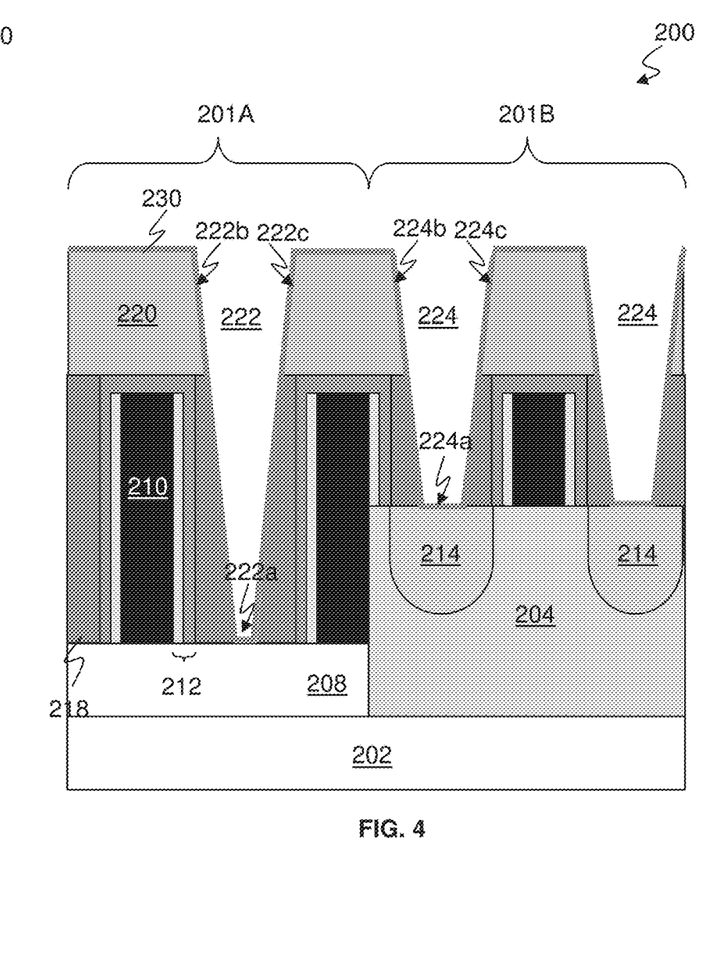

Referring to FIGS. 1 and 4, the method 100 at operation 104 deposits a dielectric layer 230 in the trench 222 and the trench 224. In many embodiments, the method 100 conformally deposits the dielectric layer 230 in the trench 222 and the trench 224 as well as over a top surface of the ILD layer 220. Specifically, the dielectric layer 230 is deposited over a bottom surface 222a and sidewall surfaces 222b and 222c of the trench 222, and over a bottom surface 224a and sidewall surfaces 224b and 224c of the trench 224. The dielectric layer 230 may be configured to further isolate the subsequently formed S/D contacts from neighboring HKMG structures 210 and may include silicon, carbon, nitrogen, oxygen, any other suitable elements, or combinations thereof. For example, the dielectric layer 230 may include silicon nitride, silicon carbonitride, silicon oxynitride, oxygen-containing silicon carbonitride, and/or other suitable dielectric materials. The dielectric layer 230 may be formed by any suitable method, such as CVD, ALD, PVD, other suitable methods, or combinations thereof.

Figure 5:
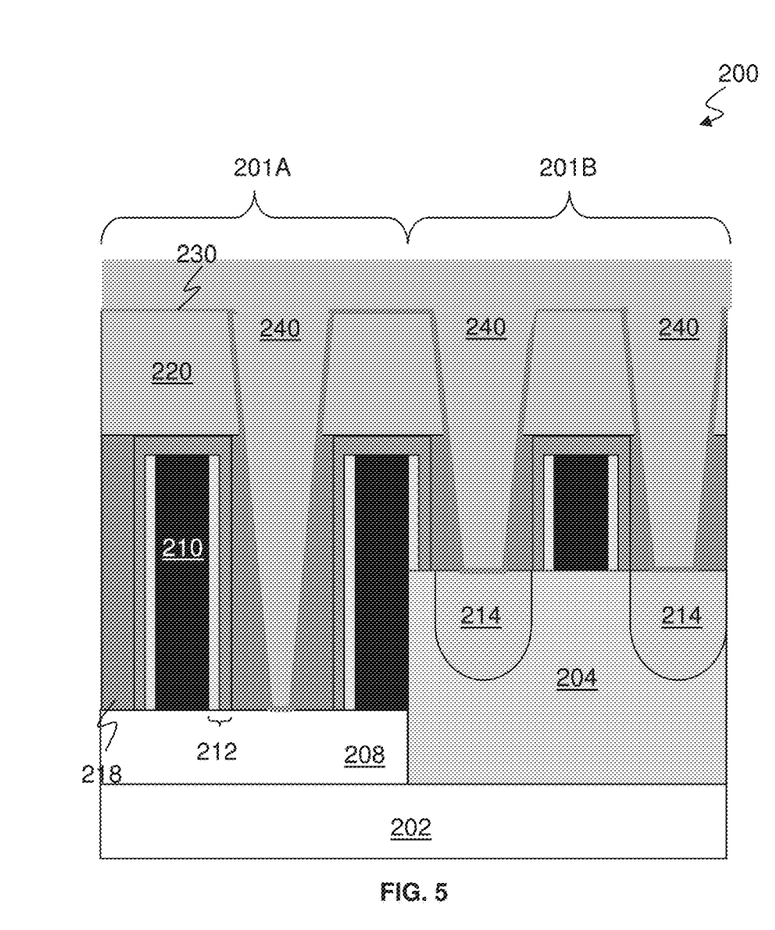

Referring to FIGS. 1 and 5, the method 100 at operation 106 fills the trench 222 and the trench 224 with a dielectric layer 240. In many embodiments, the dielectric layer 240 is a polymeric material including elements such as, for example, carbon, oxygen, hydrogen, other suitable elements, and combinations thereof. In one example embodiment, the dielectric layer 240 may include a photoresist material, i.e., may be chemically and/or physically transformed when exposed to radiation. In a further example embodiment, the dielectric layer 240 may be an anti-reflective coating (e.g., bottom anti-reflective coating, or BARC). Notably, the dielectric layer 240 has a different chemical composition from that of the dielectric layer 230, such that there exists an etching selectivity between the dielectric layer 240 and the dielectric layer 230 of the device 200. In an example embodiment, the etching selectivity between the dielectric layer 240 and the dielectric layer 230 may be realized by utilizing an etchant including, for example, hydrogen ($H_2$), nitrogen ($N_2$), or a combination thereof. In an example embodiment, the etching selectivity between the dielectric layer 240 and the dielectric layer 230 is about 20:1. The dielectric layer 240 may be formed by any suitable process, such as a spin coating process. The selective etching process is discussed in detail below.

Figure 6:
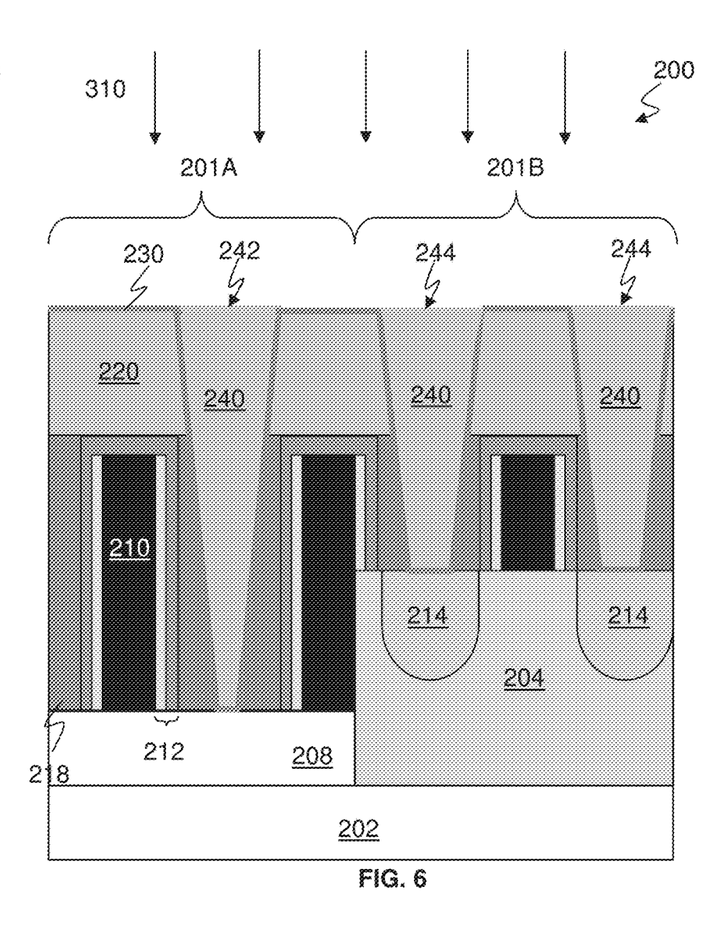
Figure 7:
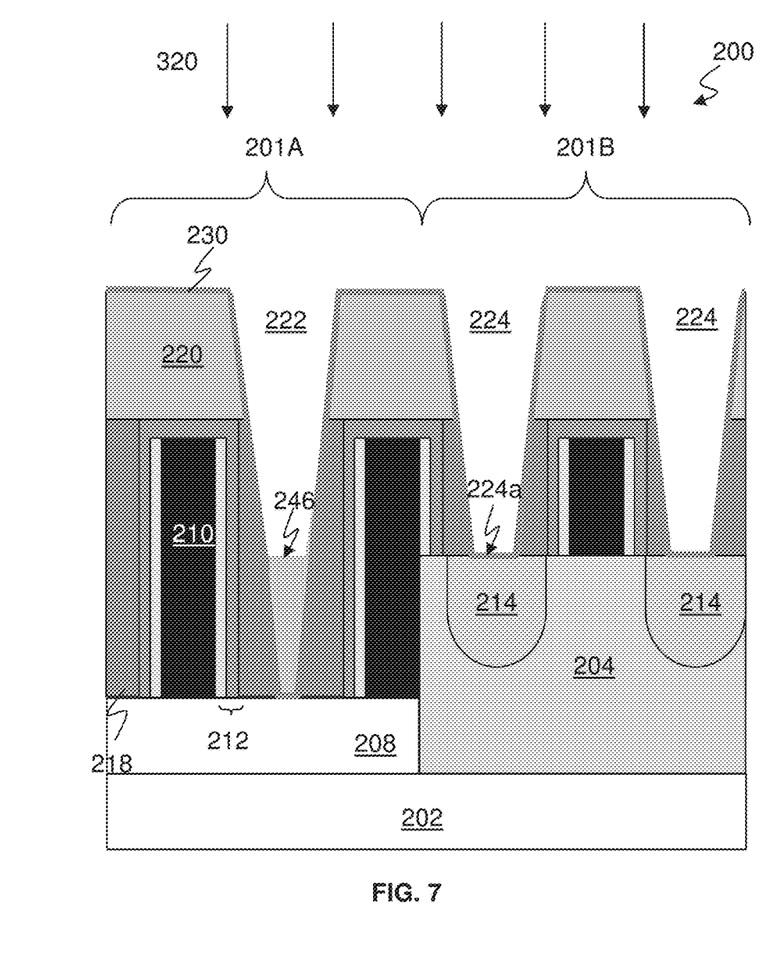

Referring to FIGS. 1, 6, and 7, the method 100 at operation 108 removes portions of the dielectric layer 240 from the trench 222 and the trench 224. In many embodiments, the method 100 at operation 108 removes some of the dielectric material 240 deposited in the trench 222, leaving behind a remaining portion 246 (FIG. 7) in the trench 222. In some embodiments, the method 100 implements operation 108 in a two-step etching process without using any masking elements (i.e., lithography process). Referring to FIG. 6, the method 100 may remove portions of the dielectric layer 240 formed over the top surface of the ILD layer 220 in a first etching process 310. The first etching process 310 may be any suitable etching process, such as a dry etching process, a wet etching process, RIE, other suitable etching processes, or combinations thereof. In the present disclosure, the first etching process 310 is a dry etching process implemented using an etchant that includes an oxygen-containing gas (e.g., $O_2$), a nitrogen-containing gas (e.g., $N_2$), or a combination thereof. In some embodiments, the first etching process 310 is controlled by monitoring changes in the end-point curve when the dielectric layer 240 is completely removed to expose the top surface of the dielectric layer 230. The end-point curve will change while the first etching process transfers from the bulk BARC to the BARC portions in the trenches, such as trenches 222 and 224. As the end-point being detected, the corresponding etching system changes to time mode to control the etch depth. Thereafter, referring to FIG. 7, a second etching process 320 is implemented to remove portions of the dielectric layer 240 from the trench 222, as well as all, or substantially all, of the dielectric layer 240 from the trench 224 to expose the bottom surface 224a of the trench 224. In other words, the dielectric layer 240 is selectively removed by the second etching process 320, while the dielectric layer 230 is not etched, or not substantially etched, in the trench 224. In the present disclosure, a portion 246 of the dielectric layer 240 remains in the trench 222 (i.e., over the isolation structure 208) after the implementation of the second etching process 320. Notably, as the dielectric layer 240 is removed by the second etching process 320, a top surface of the portion 246 is substantially co-planar with the dielectric layer 230 formed over the bottom surface 224a. The second etching process 320 may be implemented by a dry etching process using an etchant that includes an oxygen-containing gas (e.g., $O_2$), a nitrogen-containing gas (e.g., $N_2$), or a combination thereof. In many embodiments, an etching time implemented during the second etching process 320 is controlled such that the portion 246 remains in the trench 222 and no (or substantially no) dielectric layer 240 remains in the trench 224 (or over the S/D features 214).

Figure 8:
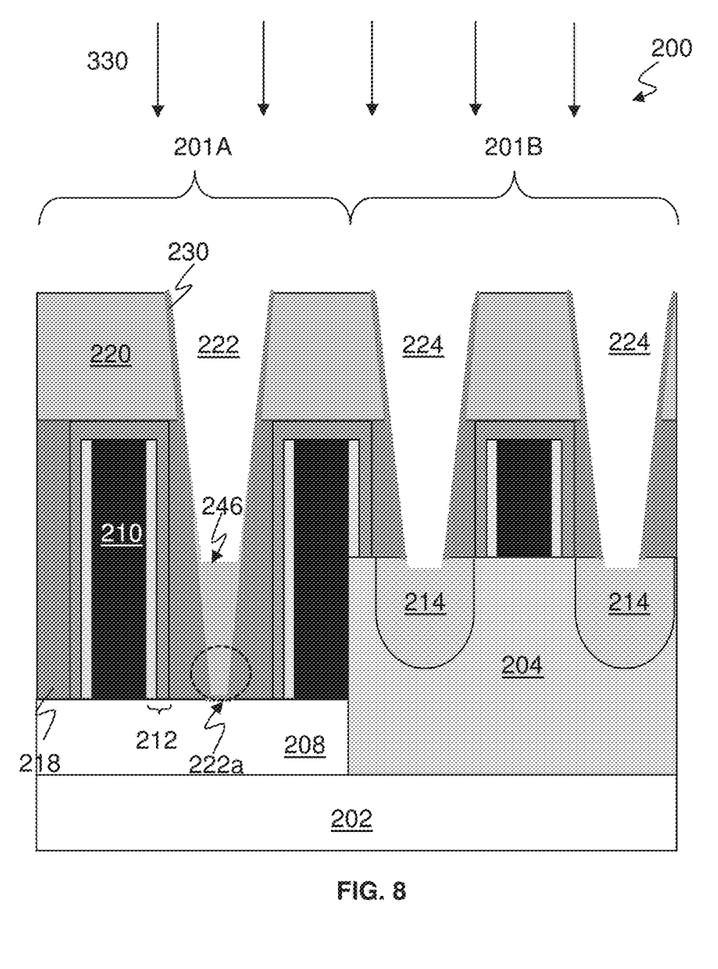

Referring to FIGS. 1 and 8, the method 100 at operation 110 removes portions of the dielectric layer 230 to expose the S/D features 214 in the trench 224. In many embodiments, the method 100 at operation 110 removes portions of the dielectric layer 230 formed over the top surface of the ILD layer 220 and the S/D features 214 by an etching process 330. In other words, the etching process 330 may be a directional etching process configured to anisotropically remove lateral portions of the dielectric layer 230 without removing, or substantially removing, portions of the dielectric layer 230 formed on sidewalls of the trenches 222 and 224. Additionally, the etching process 330 is a selective etching process configured to remove the dielectric layer 230 without removing, or substantially removing, the portion 246 remaining in the trench 222. In other words, the dielectric layer 230 is removed at a higher rate relative to the dielectric layer 240 during the etching process 330. In some embodiments, the etching process 330 is implemented using an etchant that includes a fluorine-containing gas (e.g., $CHF_3$, $CF_4$, $SF_6$, $CH_2F_2$, and/or $C_2F_6$), a sulfur-containing gas (e.g., COS), hydrogen ($H_2$), other suitable gases, or combinations thereof. In an example embodiment, the etchant includes $CHF_3$, COS, and/or $H_2$. To accomplish the anisotropic etching, the etchant may be delivered in a form of high-density plasma to enhance the directionality of the etching. The high-density plasma may include one or more charged etchant gases disclosed herein, such as a charged fluorine-containing gas, a charged sulfur-containing gas, other suitable gases, or combinations thereof. As the etching process is an anisotropic etching, the narrowest bottom portions of the trenches make the plasma accumulate, thus bottom portions have high-density plasma.

In the present disclosure, the portion 246 of the dielectric layer 240 is configured to protect a bottom portion of the trench 222 from being inadvertently damaged during the etching process 330 as discussed above. Generally, when the dielectric layer 240 is absent, i.e., when the bottom surface 222a of the trench 222 is exposed, ions produced by the high-density plasma etchant (including, $CHF_3$, COS, and/or $H_2$) may accumulate at the bottom surface 222a, thereby oxidizing the dielectric layer 230 disposed thereon. When a subsequent fabrication process (e.g., a pre-cleaning process in preparation for forming a silicide layer as discussed below) is performed, the oxidized dielectric layer 230 may be inadvertently removed, resulting in the over-etching of the ILD layer 218 to form a rounded profile (e.g., a spherical or elliptical profile) extending along the length of the fin 204 at the bottom of the trench 222. As provided herein, an intact dielectric layer 230 may be defined by a funnel-like profile having the smallest width at the bottommost portion of the trench 222 and the greatest width at the topmost portion of the trench 222. Alternatively, though not depicted, the intact dielectric layer 230 may have a profile with a substantially uniform width (e.g., the bottommost portion measuring a same width as the topmost portion) throughout its height. In contrast, as depicted in FIG. 8, the rounded profile (represented by the dotted circle) increases a width of the bottommost portion of the trench 222, thereby increasing the lateral dimension (i.e., along the length of the fin 204) of the bottom portion of the subsequently formed S/D contact. Such increase in size may reduce the separation distance between the S/D contact and a neighboring HKMG structure 210, potentially forming undesired current leakage path that leads to reduced device performance. Therefore, depositing the dielectric layer 240 to protect the bottom portion of the trench 222 while the dielectric layer 230 is selectively etched to expose the S/D features 214 may help mitigate the effects of the rounded profile.

Figure 9:
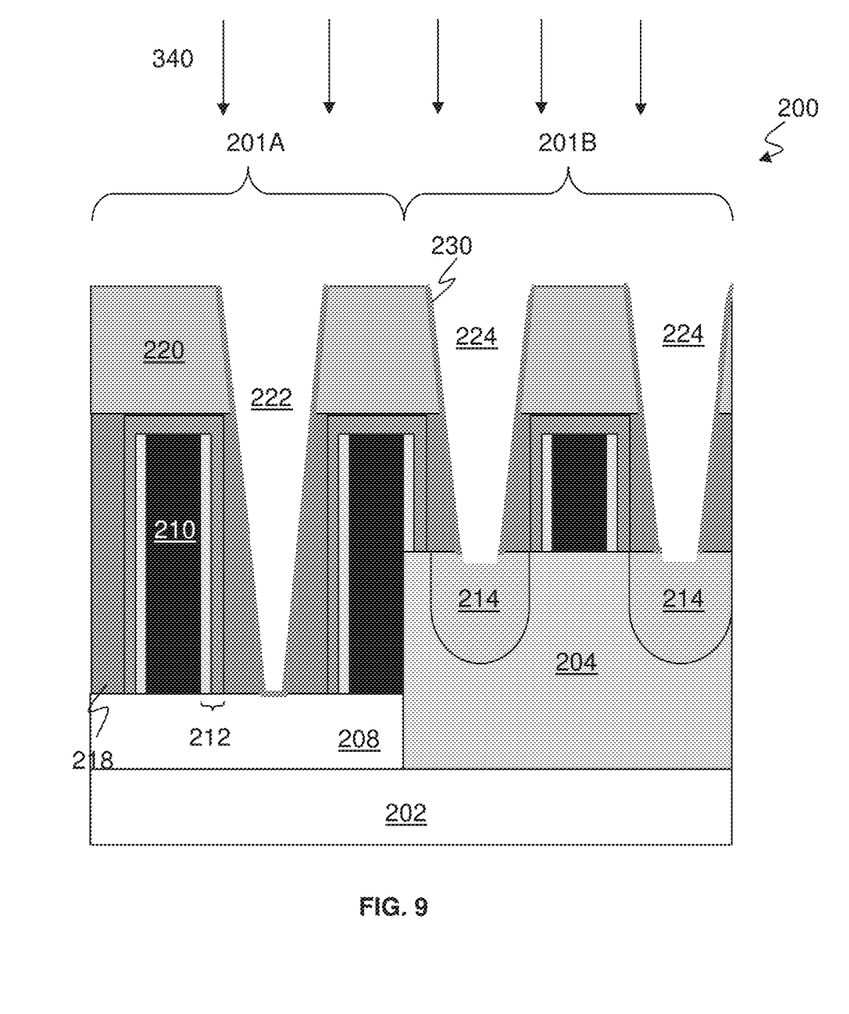

Referring to FIGS. 1 and 9, the method 100 at operation 112 removes the portion 246 remaining in the trench 222. In many embodiments, the method 100 at operation 112 implements an ashing process 340 to remove the remaining dielectric layer 240 from the trench 222. The ashing process 340 may be implemented using a plasma that includes nitrogen, hydrogen, other suitable species, or combinations thereof. During the ashing process 340, the plasma selectively removes the dielectric layer 240 with respect to the dielectric layer 230. In other words, the ashing process 340 substantially removes the dielectric layer 240 without removing or substantially removing the dielectric layer 230. In an example embodiment, an etching selectivity between the dielectric layer 230 and the dielectric layer 240 during the ashing process 340 is about 1:400. In some embodiments, the ashing process 340 is controlled by the amount of the dielectric layer 240 remaining in the trench 222. In other words, the ashing process 340 may be ceased when all of the remaining dielectric layer 240 is consumed.

Figure 10A:
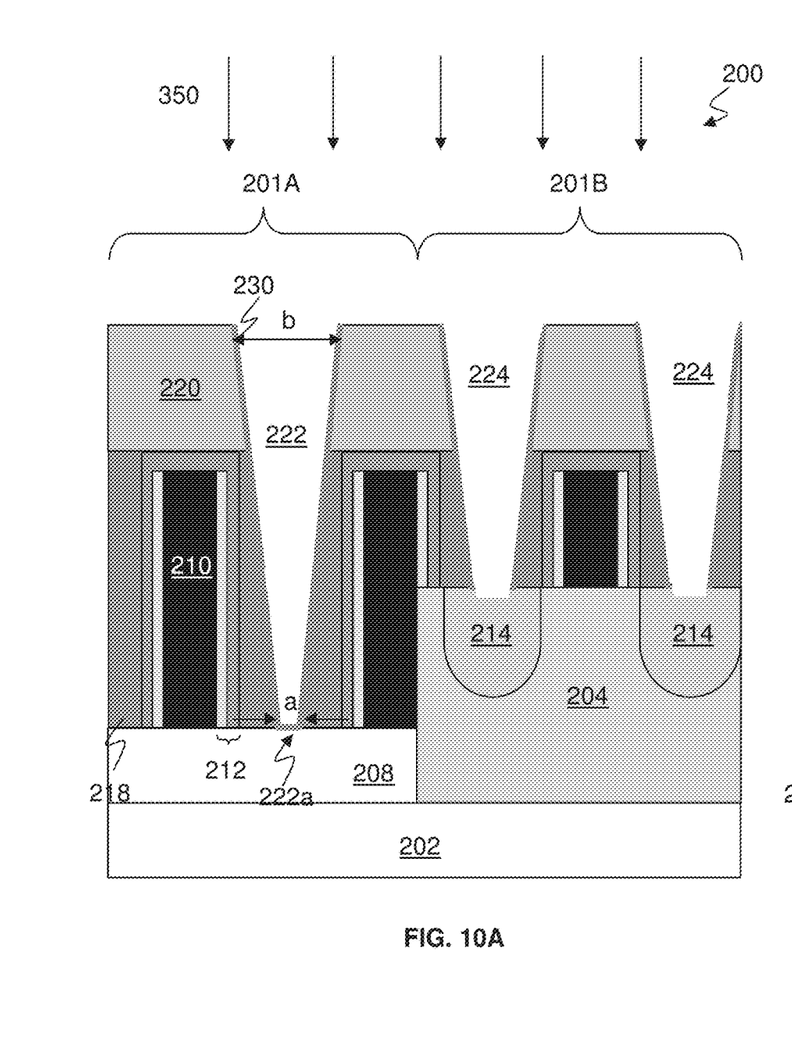

Referring to FIGS. 1, 10A, 10B, and 11, the method 100 at operation 114 forms a silicide layer 250 over the exposed S/D features 214. Referring to FIG. 10A, the forming of the silicide layer 250 may begin with a pre-cleaning process 350 designed to treat surface of the S/D features 214 exposed in the trench 224 before forming the silicide layer (e.g., the silicide layer 250). The pre-cleaning process may be performed using any suitable methods and/or materials, such as, for example, a combination of dry and wet etching processes. In some embodiments, the dry etching process is implemented using argon (Ar) gas as an etchant, and the wet etching process is implemented using a mixture of $NH_3$ and $NF_3$ as an etchant.

Figure 10B:
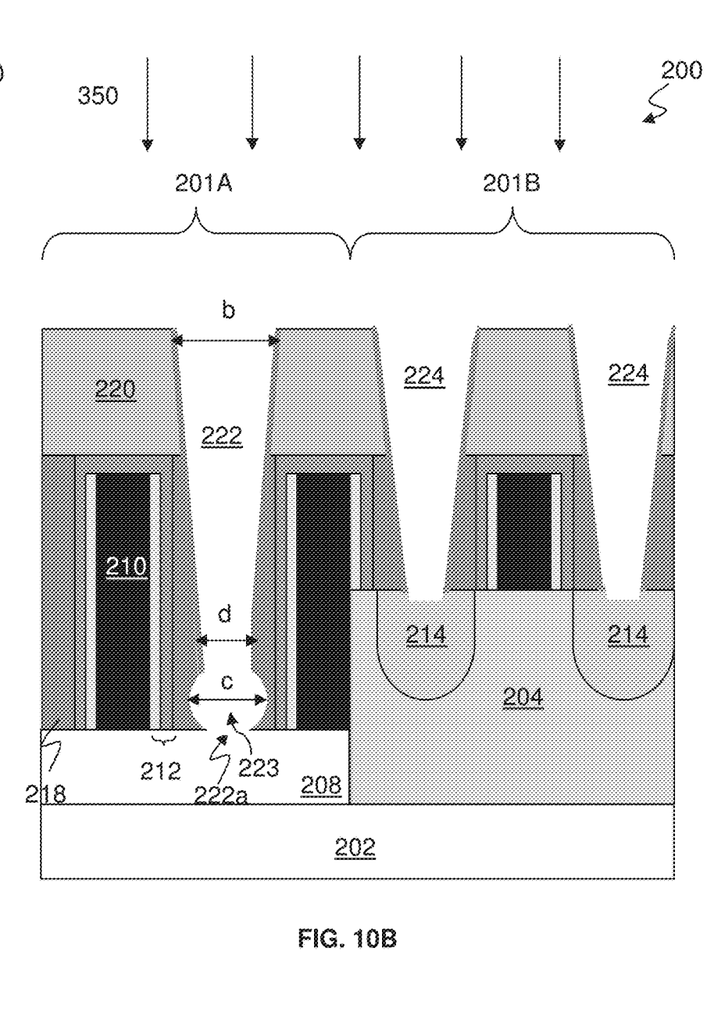

As discussed above, the accumulation of ions from the etchant used during the etching process 330 may oxidize or partially oxidize any exposed dielectric layer 230 at the bottom of the trench 222, making the dielectric layer 230 and its surrounding ILD layer 218 susceptible to damage by the cleaning agent(s) employed for the pre-cleaning process 350. Referring to FIG. 10B, the oxidized dielectric layer 230 may be removed during the pre-cleaning process 350, exposing portions of the ILD layer 218 to the etching process, thereby forming a rounded profile 223 at the bottommost portion of the trench 222. In the present disclosure, however, because the portion of the dielectric layer 230 on the bottom surface 222a was previously shielded by the dielectric layer 240 (i.e., the portion 246) during the etching process 330, it has been effectively protected from oxidation caused by ions of the high-density plasma etchant. As such, referring to FIG. 10A, the dielectric layer 230 will not be damaged by the pre-cleaning process 350, and the trench 222 maintains or substantially maintains a profile having a width a at the bottom of the trench 222 being less than a width b at the top of the trench 222. Accordingly, a width of the trench 222 decreases from the top of the trench to the bottom of the trench. As an example, referring to FIG. 10A, a ratio of a width a at the bottom of the trench 222 to a width b at the top of the trench 222 may be less than about 0.5 as provided by the present embodiments. In contrast, referring to FIG. 10B, the ratio of a width c to the width b may be greater than about 0.5 (e.g., about 0.75 or more) for a rounded profile, while the portion disposed above the rounded profile has a width d that is less than the width c. For the rounded profile 223 at the bottommost portion of the trench 222, its diameter is c. In some examples, the dimension c ranges between 10 nm-15 nm. It is noted that the round profile 223 may be slightly different from the round shape. however, its longest dimension c1 and shortest dimension c2 have a small difference, such as c1/c2 is less than 1.1, or the 2*(c1−c2)/(c1+c2) is less than 0.1.

Figure 11:
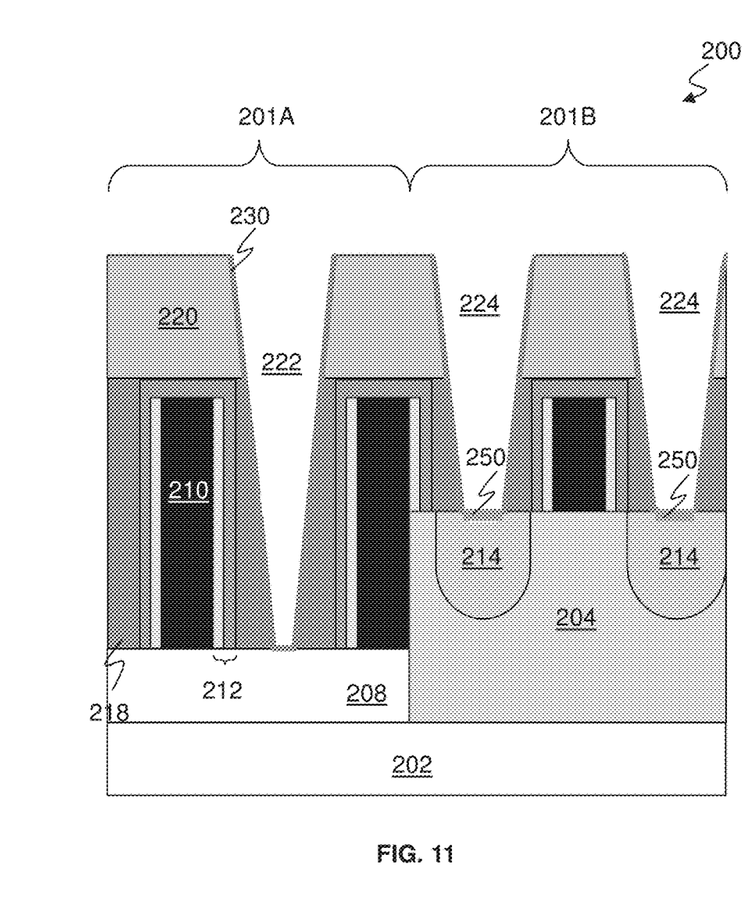

Thereafter, referring to FIG. 11, the silicide layer 250 may be formed by first depositing a metal layer using a suitable method, such as CVD, ALD, PVD, other suitable processes, or combinations thereof over the exposed S/D features 214. The device 200 may then be annealed to allow the metal layer and the semiconductor materials of the S/D features 214 to react. Thereafter, the un-reacted metal layer is removed, leaving the silicide layer 250 over the S/D features 214. Alternatively, the silicide layer 250 may be directly deposited over the S/D features 214. In many embodiments, the silicide layer 250 includes metal silicide material, such as nickel silicide, cobalt silicide, tungsten silicide, tantalum silicide, titanium silicide, platinum silicide, erbium silicide, palladium silicide, other suitable silicide, or combinations thereof.

In some embodiments, the method 100 at operation 112 optionally forms a barrier layer (not depicted) over the dielectric layer 230 and over the silicide layer 250 before proceeding to the next fabrication step. In other words, the barrier layer may be formed conformally in the trenches 222 and 224. The barrier layer may include a titanium-containing material (e.g., titanium nitride), a tantalum-containing material (e.g., tantalum nitride), a tungsten-containing material (e.g., tungsten nitride), other suitable materials, or combinations thereof. The barrier layer may be formed by any suitable method, such as ALD, CVD, PVD, other suitable methods, or combinations thereof.

Figure 12:
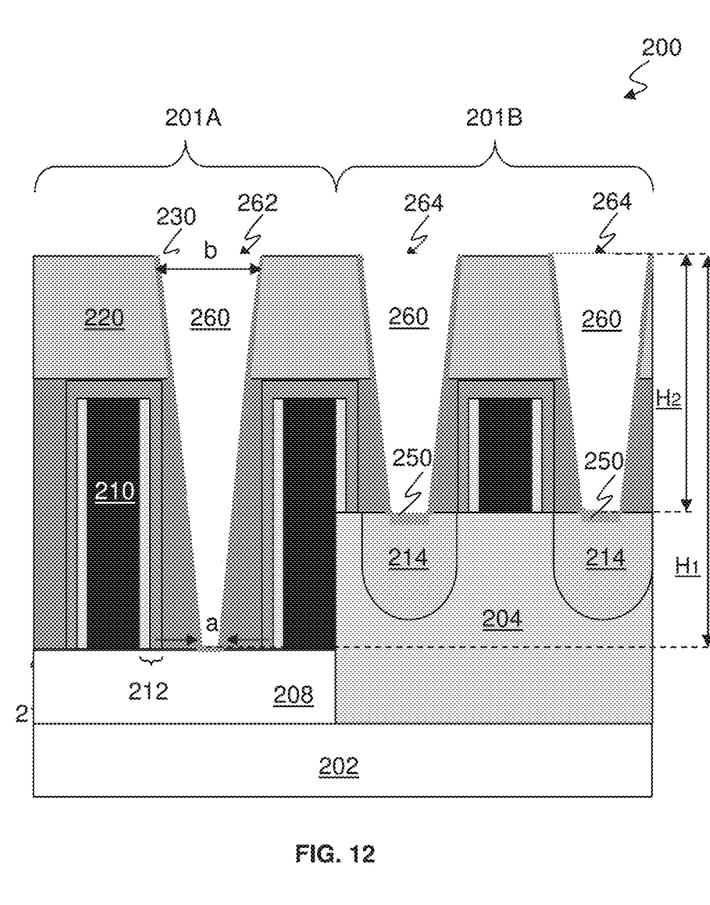

Now referring to FIG. 12, the method 100 at operation 116 deposits the conductive material 260 in the trenches 222 and 224 to form contact 262 and contact 264, respectively. The conductive material 260 may be any suitable conductive material, such as Co, W, Ru, Cu, Al, Ti, Ni, Au, Pt, Pd, other suitable conductive materials, or combinations thereof, and may be formed by any suitable method, such as CVD, ALD, PVD, plating, other suitable processes, or combinations thereof. In the depicted embodiment, the conductive material includes Co. In some embodiments, after depositing Co, a heat treatment (e.g., an annealing process) may be performed to enhance the electrical properties of Co, thereby reducing the contact resistance of the device. A planarization process, such as CMP, may be performed after the deposition of the conductive material 260, to remove excess conductive material from the top surface of the ILD layer 220. The descriptions of the widths a and b of the contact 262 as shown in FIG. 12 are consistent with those depicted and discussed with respect to FIG. 10A above. Furthermore, the contact 262 on the isolation structure 208 and the contact 264 on the S/D feature 214 have respective heights H1 and H2 different from each other. In some embodiments, the ratio H1/H2 ranges from 2 to 3.5. In some examples, H1 ranges between 90 nm and 120 nm while H2 ranges between 35 nm and 45 nm.

Notably, referring back to FIG. 10B for illustration purposes, if the bottommost portion of the trench 222 has a rounded profile due to the partial removal of the dielectric layer 230, not all of the conductive material 260 will be funneled through a narrower portion (i.e., the portion defined by the width d) of the trench 222 during the deposition process to reach the bottommost portion defined by the rounded profile (i.e., the portion defined by the width c, where d<c) as discussed above, potentially resulting in voids near the bottom surface 222a of the trench 222. For embodiments in which the conductive material 260 is Co, the post-deposition annealing process could cause a re-flow of Co toward the topmost portion of the trench 222, enlarging the volume of any voids formed at the bottommost portion of the trench 222. If, however, the bottom portion of the trench 222 has a funnel-like profile that results from the protection of the dielectric layer 240 during the etching process 330, the filling of the conductive material 260 would not be hindered since the bottommost portion of the trench 222 (i.e., the portion defined by the width a in FIG. 10A) is the narrowest portion of the trench 222. Complete filling of the trench 222 with the conductive material 260 ensures that the contact 262 retains its configuration for proper device performance.

Referring back to FIG. 1, the method 100 at operation 118 performs additional processing steps. For example, additional vertical interconnect features such as vias and/or horizontal interconnect features such as lines, and multilayer interconnect features such as metal layers and interlayer dielectrics can be formed over the device 200. The various interconnect features may implement various conductive materials including Cu, W, Co, Al, Ti, Ta, Pt, Mo, Ag, Au, Mn, Zr, Ru, their respective alloys, metal silicides, and/or other suitable materials. The metal silicides may include nickel silicide, cobalt silicide, tungsten silicide, tantalum silicide, titanium silicide, platinum silicide, erbium silicide, palladium silicide, and/or other suitable metal silicides.

Although not intended to be limiting, one or more embodiments of the present disclosure provide many benefits to a semiconductor device and the formation thereof, particularly methods of forming S/D contacts in the semiconductor device. For example, embodiments of the present disclosure provide methods of forming an S/D contact over an isolation region (e.g., STI), such that the S/D contact would retain a funnel-like profile rather than a rounded profile at its bottommost portion. In some embodiments, methods are provided for preventing the removal of a dielectric spacer formed on a bottom surface of a contact trench (or contact hole) configured for the S/D contact by depositing a protective insulating material layer over the dielectric spacer in the contact trench, such that additional fabrication processes (e.g., a pre-cleaning process for forming a silicide layer) would not incur substantial damage to the dielectric spacer as well as the surrounding ILD layer. Accordingly, embodiments of the present disclosure ensure complete filling of a conductive material in the bottommost portion of the S/D contact, as well as prevention of undesirable current leakage path being formed between the S/D contact and a nearby metal gate stack.

In one example aspect, the present disclosure provides a method of semiconductor fabrication. The method includes forming a first trench in an isolation region; forming a second trench in a device region, wherein the device region is disposed adjacent to the isolation region, and wherein each of the first and the second trenches is disposed between two metal gate structures; forming a first dielectric layer in the first and the second trenches; forming a second dielectric layer different from the first dielectric layer over the first dielectric layer; removing a portion of the second dielectric layer from the first and the second trenches, leaving behind a remaining portion of the second dielectric layer in the first trench; removing a portion of the first dielectric layer formed over a bottom surface of the second trench; subsequent to removing the portion of the first dielectric layer, removing the remaining portion of second dielectric layer from the first trench; and forming contact features in the first and the second trenches.

In another example aspect, the present disclosure provides a method of semiconductor fabrication. The method includes forming a first trench in a first region and a second trench in a second region adjacent to the first region, wherein the first region includes an isolation structure, and wherein the second region includes a source/drain (S/D) feature disposed over a semiconductor fin; depositing a first dielectric layer in the first and the second trenches; depositing a second dielectric layer over the first dielectric layer, wherein the second dielectric layer is different from the first dielectric layer; removing portions of the second dielectric layer from the first trench and the second trench, such that the second trench is free of the second dielectric layer; removing a portion of the first dielectric layer disposed over the S/D feature in the second trench; after removing the portion of the first dielectric layer, removing a remaining portion of the second dielectric layer in the first trench; forming a silicide layer over the S/D feature in the second trench; and forming a conductive feature over the first dielectric layer in the first trench and over the silicide layer in the second trench, respectively.

In yet another example aspect, the present disclosure provides a semiconductor structure. The semiconductor structure includes a first contact feature disposed over an isolation structure, wherein the first contact feature includes a first conductive layer with bottom and sidewall surfaces defined by a dielectric layer, and wherein a width of the first contact feature continues to decrease from a top surface of the first conductive layer to the bottom surface of the first conductive layer; and a second contact feature disposed over a source/drain (S/D) feature, wherein the second contact feature includes a second conductive layer, wherein sidewall surfaces of the second conductive layer are defined by the dielectric layer and a bottom surface of the second conductive layer is free of the dielectric layer.

The foregoing outlines features of several embodiments so that those of ordinary skill in the art may better understand the aspects of the present disclosure. Those of ordinary skill in the art should appreciate that they may readily use the present disclosure as a basis for designing or modifying other processes and structures for carrying out the same purposes and/or achieving the same advantages of the embodiments introduced herein. Those of ordinary skill in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor structure, comprising:
an isolation feature disposed over a semiconductor substrate;
a semiconductor fin disposed over the semiconductor substrate and adjacent to the isolation feature;
a source/drain (S/D) feature disposed over the semiconductor fin;
an interlayer dielectric (ILD) layer disposed over the isolation feature and the S/D feature;
a first contact plug disposed in the ILD layer and over the isolation feature;
a second contact plug disposed in the ILD layer and over the S/D feature; and
a dielectric layer between surfaces of the first contact plug and the ILD layer and between a sidewall of the second contact plug and the ILD layer, wherein a bottom surface of the second contact plug is free of the dielectric layer.

2. The semiconductor structure of claim 1, wherein the dielectric layer includes a material different from that of the ILD layer and that of the isolation feature.

3. The semiconductor structure of claim 1, wherein the dielectric layer directly contacts a top surface of the isolation feature.

4. The semiconductor structure of claim 1, wherein the dielectric layer includes a silicon nitride-containing material.

5. The semiconductor structure of claim 1, further comprising a silicide layer between the bottom surface of the second contact plug and the S/D feature.

6. The semiconductor structure of claim 1, wherein a ratio of a height of the first contact plug to a height of the second contact plug is 2 to 3.5.

7. The semiconductor structure of claim 1, wherein a width of the first contact plug gradually decreases from a top surface to the bottom surface of the first contact plug.

8. The semiconductor structure of claim 7, wherein a ratio of a width at the bottom surface of the first contact plug to a width at a top surface of the first contact plug is less than about 0.5.

9. The semiconductor structure of claim 1, further comprising a metal gate stack disposed over the isolation feature and between the first contact plug and the second contact plug.

10. The semiconductor structure of claim 1, wherein the first contact plug and the second contact plug each includes a cobalt-based conductive material.

11. A semiconductor structure, comprising:
a semiconductor substrate;
an isolation structure disposed over the semiconductor substrate;
a first metal contact over the isolation structure;
a semiconductor fin protruding from the semiconductor substrate and adjacent to the isolation structure;
a source/drain (S/D) feature disposed in the semiconductor fin;
a second metal contact disposed over the S/D feature;
a dielectric liner disposed along sidewalls of the first metal contact and the second metal contact; and
a metal gate stack disposed between the first metal contact and the second metal contact to contact the isolation structure.

12. The semiconductor structure of claim 11, wherein a ratio of a height of the first metal contact to a height of the second metal contact is about 2 to 3.5.

13. The semiconductor structure of claim 11, wherein the dielectric liner is in direct contact with a bottom surface of the first metal contact and free of contact with a bottom surface of the second metal contact.

14. The semiconductor structure of claim 11, wherein each of the first metal contact and the second metal contact includes a barrier layer.

15. The semiconductor structure of claim 11, wherein a ratio of a width at a narrowest portion of the first metal contact to a width at a widest portion of the first metal contact is less than about 0.5.

16. A semiconductor structure, comprising:
a semiconductor fin protruding from a substrate;
a source/drain (S/D) feature disposed in the semiconductor fin;
an isolation structure disposed over the substrate and adjacent to the semiconductor fin;
an interlayer-dielectric (ILD) layer disposed over the isolation structure, the semiconductor fin and the S/D feature;
a dielectric layer extends through the ILD layer, wherein a first portion of the dielectric layer is disposed over the isolation structure, and wherein a second portion of the dielectric layer is disposed over the S/D feature;
a first metal plug disposed over the first portion of the dielectric layer;
a second metal plug disposed over the second portion of the dielectric layer; and
a silicide layer disposed between the second metal plug and the S/D feature.

17. The semiconductor structure of claim 16, further comprising a metal gate stack over the isolation structure and the semiconductor fin, wherein the metal gate stack is embedded in the ILD layer and between the first metal plug and the second metal plug.

18. The semiconductor structure of claim 16, wherein the dielectric layer includes silicon nitride, silicon carbonitride, silicon oxynitride, oxygen-containing silicon carbonitride, or combinations thereof.

19. The semiconductor structure of claim 16, wherein a ratio of a width at a narrowest portion of the first metal plug to a width at a widest portion of the first metal plug is less than about 0.5.

20. The semiconductor structure of claim 16, further comprising a barrier layer between the dielectric layer and surfaces of the first metal plug and the second metal plug.

* * * * *